United States Patent [19]
Holmes, Jr.

[11] Patent Number: 5,115,205
[45] Date of Patent: May 19, 1992

[54] AC AMPLIFIER WITH AUTOMATIC DC COMPENSATION

[75] Inventor: Charles M. Holmes, Jr., Escondido, Calif.

[73] Assignee: Square D Company, Palatine, Ill.

[21] Appl. No.: 635,074

[22] Filed: Dec. 28, 1990

[51] Int. Cl.⁵ .............................................. H03F 3/217
[52] U.S. Cl. ...................................... 330/10; 330/251
[58] Field of Search ............... 330/10, 207 A, 251; 323/283; 363/26, 41

[56] References Cited
U.S. PATENT DOCUMENTS 4,952,884  8/1990  Tokumo et al. ...................... 330/10

*Primary Examiner*—James B. Mullins
*Attorney, Agent, or Firm*—Michael J. Femal; James W. Potthast

[57] ABSTRACT

An AC power amplifier (50) with a pair of push-pull transistors (Q1, Q2) driving opposite sides (36, 38) of the primary winding of an output transformer (T1) controlled by a pair of variable duty cycle, pulse width modulated width trains (A, B) generated on the output of a pulse width modulator (26) controlled, in turn, through means of a wave shaping feedback system to cause the AC output at the secondary winding (20) to track the output of a precision reference sine wave oscillator (12) and through means of another feedback system for automatic DC compensation including a pair of CMOS analog switches respectively driven by the two pulse width modulated pulse trains (A on 28, B on 30) to produce a pair of feedback signals. A junction (58) couples the pair of feedback signals to form a composite feedback signal and an error amplifier (14) also used in the wave shaping feedback system, responds to the composite feedback signal to balance the duty cycles of the pair of drive signals to reduce the introduction of DC to the output transformer (T1).

17 Claims, 2 Drawing Sheets

AC AMPLIFIER WITH AUTOMATIC DC COMPENSATION

BACKGROUND OF THE INVENTION

1. Technical Field

The invention relates to an AC amplifier and, more particularly, to an AC amplifier with automatic DC compensation.

2. Description of the Related Art

Current in the primary winding of an output transformer of a push-pull like AC power amplifier is not desirable, since it severely degrades the performance of the amplifier. This DC current can develop as a result of various circuit imbalances.

Referring to FIG. 1, a block diagram of a known switching amplifier 10 which is used as an uninterruptable power supply to provide standard 120V, 60Hz system output power at an output 11 is shown. A precision sine wave oscillator 12 generates a sixty Hz reference sine wave signal as the input of a wave shaping feedback system formed by the remaining circuitry. An error amplifier 14 compares the reference sine wave signal at an input 16 of the error amplifier with the system output applied to an input 18. The system output at input 18 is taken from the secondary winding 20 of a transformer T1 and applied to input 18 through means of a feedback line 19. The error amplifier 14 generates an error signal on its output 22 that is either positive or negative with respect to a preselected reference voltage from a reference voltage source 24 depending on the relation of the magnitude of the system output signal at input 18 with the magnitude of the wave shaping feedback system input at input 16. The magnitude of the error signal on output 22 thus depends on the magnitude of the error between the system output signal at input 18 and the system input signal at input 16 of the differential error amplifier 14.

The error signal an output 22 is applied to a conventional DC controlled pulse width modulator 26. The pulse width modulator produces two drive signals, A and B, on modulator outputs 28 and 30, respectively. These A and B drive signals are amplified by a pair of amplifiers 32 and 34, and the amplified drive signals are then applied to drive a pair of switching transistors Q1 and Q2.

When the error signal is positive with respect to the reference from the reference voltage source 24, signal A on output 28 is active. A stream of high frequency pulses is applied to turn Q1 on and off at a high frequency on the order of sixty KHz. When transistor Q1 is intermittently turned on, one side 36 of the primary winding of transformer T1 is intermittently driven to ground relative to DC voltage VS applied to a center tap 40. This produces a positive polarity phase of the AC output signal at output 11. The magnitude of the error signal controls the duty cycle of these pulses: A large error signal produces a large duty cycle, as high as 95 percent, while a small error signal produces a small duty cycle, as small as five percent. In a complementary and similar manner, a negative error signal causes signal B on output 30 to control the duty cycle of the pulse train applied to switching transmitter Q2. When Q2 is turned on, the other side 38 of the primary winding is connected to ground and the negative polarity phase of the AC output signal is generated.

The output transformer T1 and a filter capacitor C1 low pass filter the alternating streams of positive and negative high frequency pulses applied to the primary winding to produce therefrom a smooth AC sinusoidal output signal. The magnitude of the AC output voltage is proportional to the magnitude of the duty cycle of the drive signal applied across the primary winding.

A major problem with the AC amplifier of FIG. 1 is the introduction of DC current into the output transformer. The DC current may arise from several different imbalances in the system, but the most important factor controlling the DC current is the average duty cycle of the output transistors Q1 and Q2. If the average duty cycles of the drive signals A and B are equal, then the current due to this factor will be zero. If the average duty cycles are not equal, a net DC voltage will be applied to the output transformer 20, resulting in a net DC current.

It is known to have local feedback signal applied to the error amplifier 14 through means of a differential amplifier 46 having one input 42 connected to the output of error amplifier 14 and another input 44 connected to the reference voltage source 24. This tends to cause the average value of the error signal on output 22 to equal the reference voltage of source 24 since it tends to equalize the duty cycles. However, because of various system imperfections and the static nature of the feedback, a net DC imbalance can still result.

SUMMARY

It is therefore the primary object of the present invention to provide an AC amplifier with automatic DC compensation.

This object is achieved by provision in an AC amplifier for producing an AC power output signal by combining a pair of alternately generated, pulse width modulated drive signals with an automatic DC compensation circuit for automatically reducing the average DC value of the AC power output signal. This automatic DC compensation circuit has both means responsive to a first one of said pair of drive signals for generating a first feedback signal representative of the average DC value of the first one of said pair of drive signals, means responsive to a second one of said pair of drive signals for generating a second feedback signal representative of the average DC value of the second one of said pair of drive signals, means for combining said first and second feedback signals to form a composite feedback signal representative of the average DC value of the combined first and second feedback signals, and means responsive to the composite feedback signal to balance the duty cycles of the first and second drive signals.

Preferably, the duty cycle balancing means has means for generating an error signal based on a comparison between the AC power output signal and the reference AC signal, means responsive to the error signal to alter the duty cycles of the first and second drive signals, and means for altering the error signal in accordance with the composite feedback signal to balance the duty cycles of the first and second drive signals.

A further object of the invention is to provide an AC amplifier with automatic DC compensation having means for generating a pulse width modulated signal with alternating opposite polarities and a varying duty cycle and means for controlling the duty cycle of the pulse width modulated signal to produce therefrom an AC output signal including a feedback system responsive both to the power output signal for AC wave shaping and to the duty cycle of the pulse width modulated signal to reduce the introduction of DC into the AC power output signal.

Preferably, the feedback system of the AC amplifier has means for providing a DC error signal representative of both the difference between an AC reference signal and the AC power output signal and the difference in duty cycles of the pulse width modulated signal when in one phase versus when it is in a phase opposite to the one phase.

Also, preferably the error signal producing means has a first switch responsive to the pulse width modulated signal when in one of said opposite polarities, a second switch responsive to the pulse width modulated signal when in the other of said opposite polarities and means for combining outputs of said first and second switches to produce a composite feedback signal representative of the difference in average duty cycles of the pulse width modulated signal when in one phase versus the average duty cycle of the pulse width modulated signal when in another phase opposite to said one phase.

BRIEF DESCRIPTION OF THE DRAWINGS

The foregoing objects and advantageous features of the invention will be explained in greater detail and others will be made apparent from the detailed description of the preferred embodiment of the present invention which is given with reference to the two figures of the drawing, in which.

DESCRIPTION OF THE PREFERRED EMBODIMENTS

Figure 1:
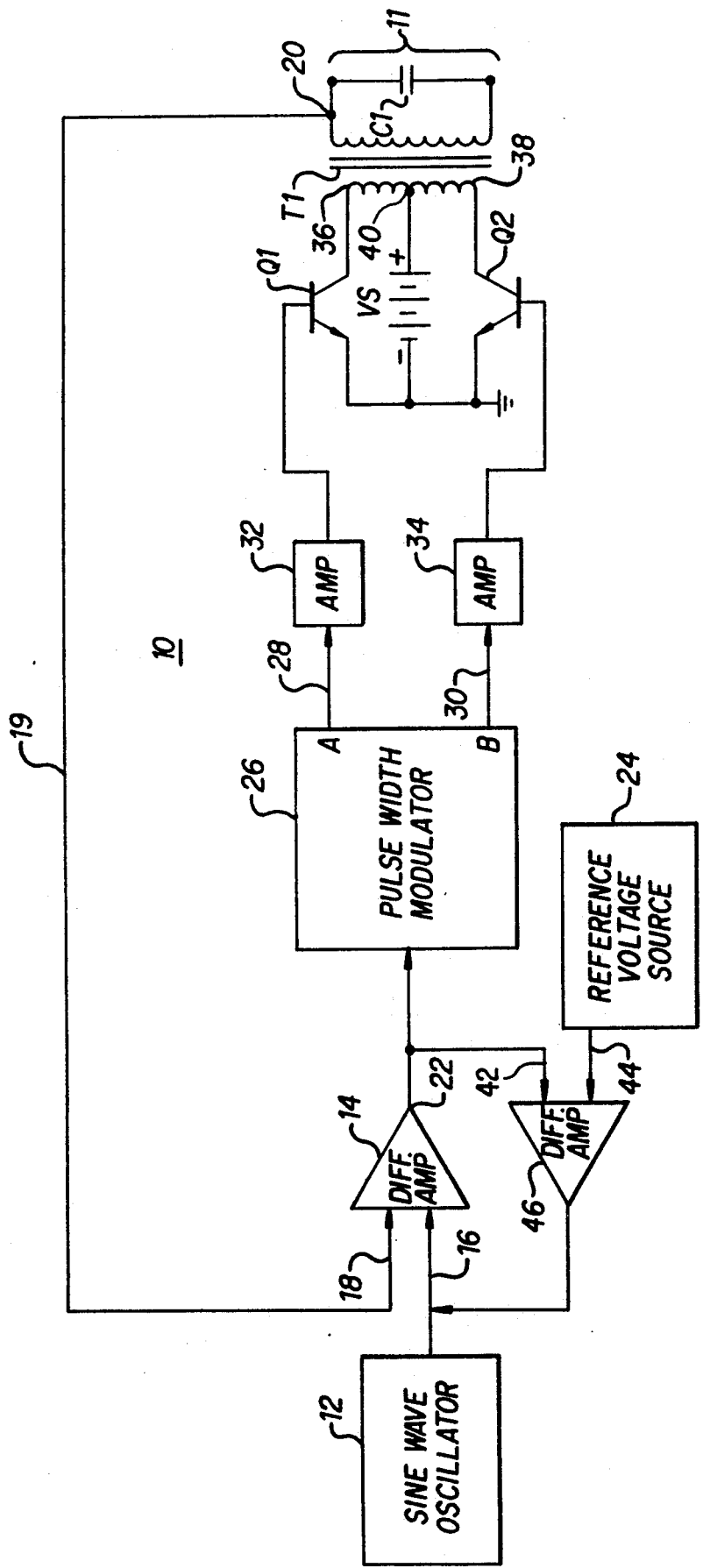
FIG. 1 is a functional block and schematic diagram of an AC amplifier of the prior art with nonautomatic DC compensation using a local, static feedback system.
Figure 2:
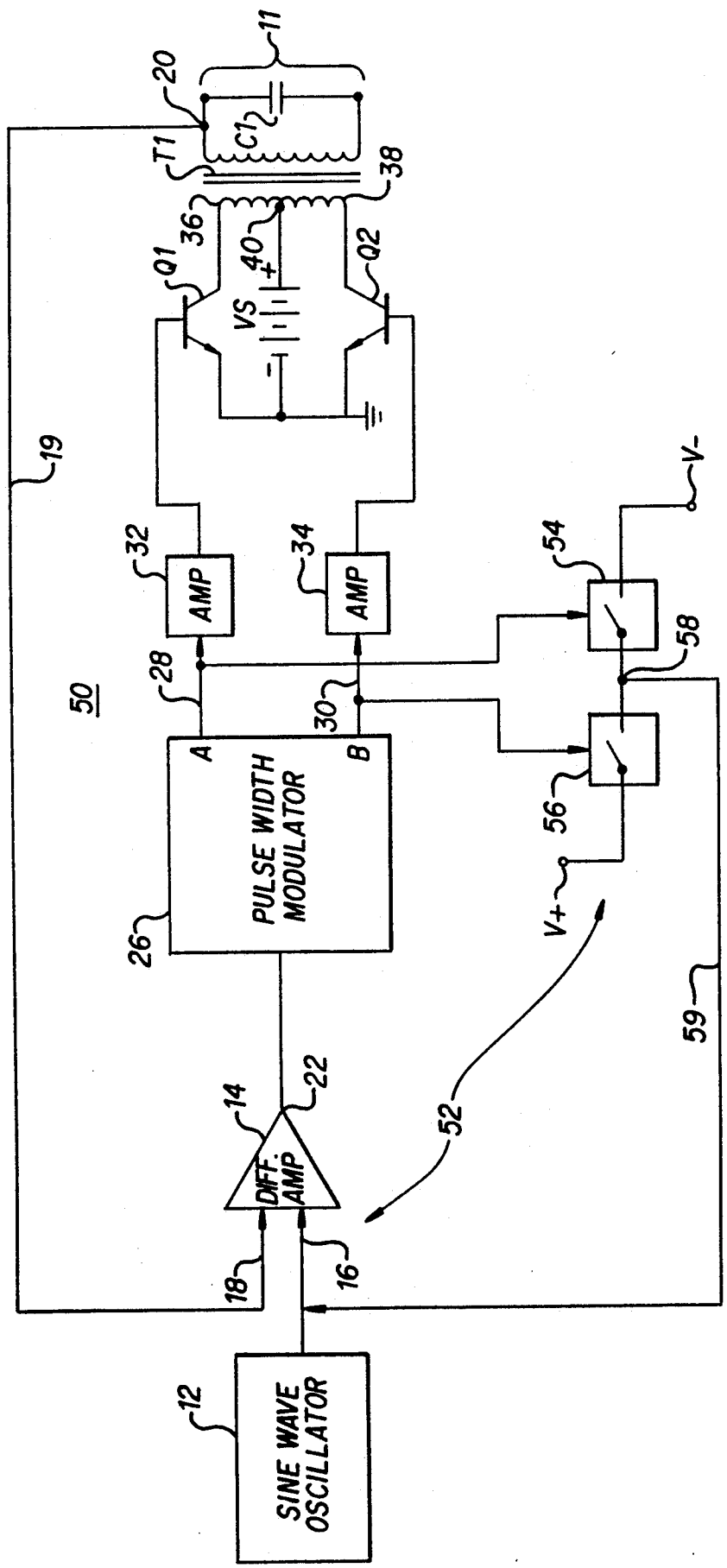
FIG. 2 is a functional block and schematic diagram of the preferred embodiment of the AC amplifier with automatic DC compensation of the present invention.

Referring now to FIG. 2, the preferred embodiment of the AC amplifier 50 of the present invention is shown in which functional elements which are the same or similar to those of the prior art amplifier 10 of FIG. 1. As seen, the local feedback provided by the reference voltage source 24 and differential feedback amplifier 40 have been eliminated. Instead, a feedback system is provided in which a feedback signal is derived directly from the duty cycles of the variable duty cycle pulse width modulated drive signals A and B on outputs 28 and 30.

The automatic DC compensation circuit 52 includes two CMOS analog switches 54 and 56 respectively connected to DC supply voltages V+ and V− of equal magnitudes and opposite polarities, a junction 58 at which the outputs of the switches 54 and 56 are combined and the error amplifier 14 which now serves a new multiple function. Switch 54 is controlled by drive signal A on output 28 of the pulse width modulator 26 to provide a first feedback signal representative of the average DC value of the first one of the pair of drive signals A and B. Switch 56 is likewise controlled by drive signals B on output 30 to produce a second feedback signal. The junction 58 combines the first and second feedback signals to form a composite feedback signal representative of the average DC value of the combined first and second feedback signals. The composite feedback signal at 58 is coupled by a lead 59 to input 16 of error amplifier 14 to alter the output of the sine wave oscillator 12 and thus alter the error signal at output 22 to balance the duty cycles of the first and second drive signals A and B.

When signal A is active, transistor Q1 is operating, and the AC output 11 is driven positive, and the average magnitude of the feedback signal at junction 58 is driven negative. When signal B is active, the AC output is driven negative, and average magnitude of the feedback signal at junction 28 is driven positive. The stream of positive and negative pulses thus produced at the junction 58 of the two analog switches 54 and 56 will have an average DC value of zero, if the average duty cycle to the two signals A and B are equal. If the average duty cycles of the A and B signals are not equal, then the average DC value of the AC output signal will vary according to the imbalance in duty cycle.

The composite feedback signal at the junction 58 and applied to input 16 of the error amplifier 14 forms a negative feedback loop to regulate the balance of the average duty cycle of signals A and B. The action of this negative feedback loop is to force the average duty cycle of signal A to equal the average duty cycle of B to thereby reduce or eliminate the net DC voltage applied to the output transformer T1.

While a preferred embodiment of the present invention has been disclosed, it should be appreciated the broad inventive concept is not limited to this particular embodiment or to this exact type of amplifier. For instance, in addition to a push-pull amplifier, as shown, the invention could also be employed successfully in a bridge amplifier, or the like. Also, while two separate drive signals are shown, it should be understood that, since these are generated alternately, a single drive signal alternately switched to the transformers Q1 and Q2 could also be employed. In fact, the composite of the drive signals A and B as taken across outputs 28 and 30 can be combined as a single drive signal with attenuating phases associated with the opposite polarities of the AC output signal. Accordingly, reference should be made to the appended claims for a determination of the scope of the invention.

I claim:

1. In an AC amplifier for providing an AC power output signal by combining a pair of alternately generated, bipolar, pulse width modulated drive signals, the improvement being an automatic DC compensation circuit for automatically reducing the average DC value of the AC power output signal, comprising:
    means responsive to a first one of said pair of drive signals for generating a first feedback signal representative of the average DC value of the first one of said pair of drive signals;
    means responsive to a second one of said pair of drive signals for generating a second feedback signal representative of the average DC value of the second one of said pair of drive signals;
    means for combining said first and second feedback signals to form a composite feedback signal representative of the average DC value of the combined first and second feedback signals; and
    means responsive to the composite feedback signal to balance the duty cycles of the first and second drive signals.

2. The AC amplifier of claim 1 in which
    said first feedback signal generating means includes
    a first source of DC power having a first polarity, and
    a first switch responsive to the first one of said pair of drive signals for periodically connecting the first source of voltage to a first output terminal thereof to produce said first feedback signal thereon in accordance with the first one of the pulse width modulated drive signal, said second feedback signal generating means includes a second source of DC voltage having a second polarity opposite that of the first source of DC power, and a second switch responsive to the second one of said pair of drive signals for periodically connecting the second source of voltage to a second output terminal thereof to produce said second feedback signal thereon in accordance with the second one of the pulse width modulated drive signals, and said combining means includes means for connecting together the first and second output terminals.

3. The AC amplifier of claim 1 in which said combining means includes means for summing the first and second feedback signals.

4. The AC amplifier of claim 1 in which said first and second feedback signals are negative feedback signals.

5. The AC amplifier of claim 1 including a) means for providing a reference AC signal, and in which said duty cycle balancing means includes 1) means for generating an error signal based on a comparison between the AC power output signal and the reference AC signal, 2) means responsive to the error signal to alter the duty cycles of the first and second drive signals, and 3) means for altering the error signal in accordance with a combination of the reference AC signal and the composite feedback signal to balance the duty cycles of the first and second drive signals.

6. The AC amplifier of claim 5 including a) a center tap transformer with a primary winding and a secondary winding, and b) means for coupling the first and second drive signals to opposite sides of the primary winding, and in which said error signal generating means includes 1) a comparator circuit having one input connected to the secondary winding, and 2) another input connected with the reference AC signal providing means, and c) said error signal altering means includes means for altering the signal applied to said other input of the comparator circuit, and in which said altering means includes a coupling of the composite feedback signal to the reference AC signal.

7. The AC amplifier of claim 5 in which said duty cycle altering means includes a pulse width modulator for alternately generating said first and second drive signals in accordance with changes in polarity of the drive signal.

8. The AC amplifier of claim 7 in which said pulse width modulator varies the duty cycle of the first and second drive signal being generated thereby in accordance with the magnitude of the error signal.

9. The AC amplifier of claim 1 in which said duty cycle balancing means includes a pulse width modulator, and means for controlling the pulse width modulator in accordance with the composite feedback signal.

10. The AC amplifier of claim 1 in which said composite feedback signal forming means includes a pair of switches operating in a push-pull mode in response to said first and second drive signals.

11. An AC amplifier with DC compensation, comprising:

a) means for generating a pulse width modulated signal having alternating opposite polarities and a varying duty cycle; and b) means for controlling the duty cycle of the pulse width modulated signal to produce therefrom an AC power output signal including a feedback system responsive both to the AC power output signal for AC wave shaping and to the duty cycle of the pulse width modulated signal to reduce the introduction of DC into the AC power output signal.

12. The AC amplifier of claim 11 in which said feedback system includes means for providing a DC error signal representative of both the difference between an AC reference signal and the AC power output signal and the difference in duty cycles of the pulse width modulated signal when in one phase versus when it is in a phase opposite to the one phase.

13. The AC amplifier of claim 12 in which said error signal producing means includes a first switch responsive to the pulse width modulated signal when in one of said opposite polarities;

a second switch responsive to the pulse width modulated signal when in the other of said opposite polarities; and means for combining outputs of said first and second switches to produce a composite feedback signal representative of the difference in average duty cycles of the pulse width modulated signal when in one phase versus the average duty cycle of the pulse width modulated signal when in another phase opposite to said one phase.

14. The AC amplifier of claim 13 in which said error signal means includes means for combining the composite feedback signal with the AC reference signal to produce the DC error signal responsive of the differences in the duty cycle.

15. The AC amplifier of claim 14 in which said feedback system includes means for combining said composite feedback signal with the AC reference signal to produce the DC error signal responsive of the differences in the duty cycle.

16. The AC amplifier of claim 13 in which said feedback system includes means for combining said composite feedback signal with the AC output feedback signal to produce the DC error signal responsive of the differences in the AC output wave shape.

17. The AC amplifier of claim 13 in which said pulse width providing means includes a controlled pulse width modulator for producing a pair of variable duty cycle signals which are combined to form a bipolar, pulse width modulated signal.

* * * * *